(12) United States Patent
Loopstra et al.

(10) Patent No.: US 8,431,916 B2
(45) Date of Patent: Apr. 30, 2013

(54) RADIATION SOURCE AND LITHOGRAPHIC APPARATUS

(75) Inventors: Erik Roelof Loopstra, Eindhoven (NL);
Vadim Yevgenyevich Banine, Deume (NL); Gerardus Hubertus Petrus Maria Swinkels, Eindhoven (NL); Erik Petrus Buurman, Veldhoven (NL)

(73) Assignee: ASML Netherlands B.V., Veldhoven (NL)

(*) Notice: Subject to any disclaimer, the term of this patent is extended or adjusted under 35 U.S.C. 154(b) by 156 days.

(21) Appl. No.: 12/611,269

(22) Filed: Nov. 3, 2009

(65) Prior Publication Data

US 2010/0110405 A1      May 6, 2010

Related U.S. Application Data

(60) Provisional application No. 61/111,149, filed on Nov. 4, 2008, provisional application No. 61/172,637, filed on Apr. 24, 2009.

(51) Int. Cl.
*H05G 2/00* (2006.01)

(52) U.S. Cl.
USPC ..................................................... 250/504 R

(58) Field of Classification Search ............ 250/504 R, 250/378, 492.1, 492.2
See application file for complete search history.

(56) References Cited

U.S. PATENT DOCUMENTS

| | | | | |
|---|---|---|---|---|
| 5,136,422 A * | 8/1992 | Ukon | ............................ | 359/366 |
| 5,647,664 A * | 7/1997 | Hanecka | ........................ | 362/308 |
| 5,737,137 A * | 4/1998 | Cohen et al. | ................... | 359/859 |
| 6,339,467 B1 * | 1/2002 | Sato | ................................. | 355/77 |
| 6,507,440 B1 * | 1/2003 | Schultz | ......................... | 359/626 |
| 7,075,713 B2 * | 7/2006 | Arenberg | ....................... | 359/359 |
| 7,119,880 B2 * | 10/2006 | Suzuki | ............................ | 355/53 |
| 7,227,613 B2 * | 6/2007 | Ryzhikov et al. | ............... | 355/53 |
| 7,274,432 B2 * | 9/2007 | Kroon | ............................ | 355/30 |
| 7,329,886 B2 * | 2/2008 | Singer et al. | ................ | 250/493.1 |
| 7,449,704 B2 * | 11/2008 | Fomenkov et al. | ........ | 250/504 R |
| 7,456,408 B2 * | 11/2008 | Mann et al. | .................... | 250/365 |
| 7,501,641 B2 * | 3/2009 | Silverman et al. | .......... | 250/492.2 |
| 7,781,750 B2 * | 8/2010 | Singer | ........................ | 250/504 R |
| 2005/0230645 A1 * | 10/2005 | Melnychuk et al. | ....... | 250/504 R |
| 2005/0274912 A1 * | 12/2005 | Hergenhan et al. | ........ | 250/504 R |
| 2007/0030948 A1 * | 2/2007 | Singer et al. | .................... | 378/34 |
| 2008/0017801 A1 * | 1/2008 | Fomenkov et al. | .......... | 250/354.1 |
| 2008/0073598 A1 * | 3/2008 | Moriya et al. | ............ | 250/504 R |
| 2008/0083887 A1 * | 4/2008 | Komori et al. | ............ | 250/504 R |

* cited by examiner

*Primary Examiner* — Robert Kim
*Assistant Examiner* — Jason McCormack
(74) *Attorney, Agent, or Firm* — Pillsbury Winthrop Shaw Pittman LLP (57) ABSTRACT

A source configured to generate EUV radiation includes a fuel droplet generator configured to deliver a droplet of fuel to an interaction point, optics configured to deliver fuel vaporizing and exciting radiation to the interaction point to generate a plasma, and a collector arranged to collect EUV radiation emitted by the plasma. The optics are arranged such that in use the fuel vaporizing and exciting radiation is incident upon more than one side of the fuel droplet at the interaction point.

19 Claims, 7 Drawing Sheets

RADIATION SOURCE AND LITHOGRAPHIC APPARATUS

CROSS-REFERENCE TO RELATED APPLICATIONS

This application claims the benefit of priority from U.S. Provisional Patent Application Ser. No. 61/111,149, filed Nov. 4, 2008, and U.S. Provisional Patent Application Ser. No. 61/172,637, filed Apr. 24, 2009, the contents of both of which are incorporated herein by reference in their entireties.

FIELD

The present invention relates to a radiation source, and to a lithographic apparatus which includes the radiation source. The invention is suitable for use in manufacturing devices, integrated circuits, integrated optical systems, guidance and detection patterns for magnetic domain memories, flat-panel displays, liquid-crystal displays (LCDs), thin-film magnetic heads, and the like, by lithography, particularly high resolution lithography.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 \lambda / NA_{PS} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$, or by decreasing the value of $k_1$.

In order to shorten the exposure wavelength, and thus reduce the minimum printable size, it has been proposed to use an extreme ultraviolet (EUV) radiation source. EUV radiation sources are configured to output a radiation wavelength of around 13 nm (generally in the range 5-20 nm). Thus, EUV radiation sources may constitute a significant step toward achieving printing of small features. Such radiation is termed extreme ultraviolet or soft x-ray, and possible sources include, for example, laser-produced plasma sources, discharge plasma sources, or synchrotron radiation from electron storage rings.

It is desirable to use an EUV source which provides homogeneous EUV radiation. Inhomogeneities in the EUV radiation may reduce the accuracy with which the lithographic apparatus can project a pattern onto a substrate. It may not be possible in practice to provide EUV radiation which is fully homogeneous.

It is desirable to provide an EUV radiation source configured to provide EUV radiation which is more homogeneous than the EUV radiation produced by at least some prior art EUV radiation sources.

SUMMARY

According to an aspect of the invention, there is provided a source of EUV radiation comprising a fuel droplet generator configured to deliver a droplet of fuel to an interaction point, optics configured to deliver fuel vaporizing and exciting radiation to the interaction point and thereby generate a plasma, and a collector arranged to collect EUV radiation emitted by the plasma, wherein the optics are arranged such that in use the fuel vaporizing and exciting radiation will be incident upon more than one side of the fuel droplet at the interaction point.

According to an aspect of the invention, there is provided a source configured to generate EUV radiation. The source includes a fuel droplet generator configured to deliver a droplet of fuel to an interaction point, and optics configured to deliver fuel vaporizing and exciting radiation to the interaction point to generate a plasma. The optics are arranged such that in use the fuel vaporizing and exciting radiation is incident upon more than one side of the fuel droplet at the interaction point. The source also includes a collector arranged to collect EUV radiation emitted by the plasma.

According to an aspect of the invention, there is provided a source of EUV radiation comprising a fuel droplet generator configured to deliver a droplet of fuel to an interaction point, optics configured to deliver fuel vaporizing and exciting radiation to the interaction point and thereby generate a plasma, and a collector arranged to collect EUV radiation emitted by the plasma, wherein the optics are arranged to deliver the fuel vaporizing and exciting radiation to the interaction point with a converging annular distribution.

According to an aspect of the invention, there is provided a source configured to generate EUV radiation. The source includes a fuel droplet generator configured to deliver a droplet of fuel to an interaction point, and optics configured to deliver fuel vaporizing and exciting radiation to the interaction point to generate a plasma. The optics are arranged to deliver the fuel vaporizing and exciting radiation to the interaction point with a converging annular distribution. The source also includes a collector arranged to collect EUV radiation emitted by the plasma.

The EUV radiation source of the embodiments of the invention may form part of a lithographic apparatus.

According to an aspect of the invention, there is provided a lithographic apparatus that includes a source configured to generate EUV radiation. The source includes a fuel droplet generator configured to deliver a droplet of fuel to an interaction point, and optics configured to deliver fuel vaporizing and exciting radiation to the interaction point to generate a plasma. The optics are arranged such that in use the fuel vaporizing and exciting radiation is incident upon more than one side of the fuel droplet at the interaction point. The source also includes a collector arranged to collect EUV radiation emitted by the plasma. The lithographic apparatus also includes an illumination system configured to condition an EUV radiation beam formed by the collector, and a support structure constructed to hold a patterning device. The patterning device is capable of imparting the EUV radiation beam with a pattern in its cross-section to form a patterned EUV radiation beam. The lithographic apparatus also includes a substrate table constructed to hold a substrate, and a projection system configured to project the patterned EUV radiation beam onto a target portion of the substrate, According to an aspect of the invention, there is provided a method of generating EUV radiation comprising delivering a droplet of fuel to an interaction point, delivering fuel vaporizing and exciting radiation to the interaction point such that the fuel droplet vaporizes and forms a plasma, using a collector to collect the EUV radiation emitted by the plasma and to form the EUV radiation into a beam which may be used for lithography, wherein the fuel vaporizing and exciting radiation is incident upon more than one side of the fuel droplet at the interaction point.

According to an aspect of the invention, there is provided a method of generating EUV radiation. The method includes delivering a droplet of fuel to an interaction point, delivering fuel vaporizing and exciting radiation to the interaction point such that the fuel vaporizing and exciting radiation is incident upon more than one side of the fuel droplet at the interaction point such that the fuel droplet vaporizes and forms a plasma, collecting the EUV radiation emitted by the plasma with a collector, and forming the EUV radiation into a beam for use in lithography.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
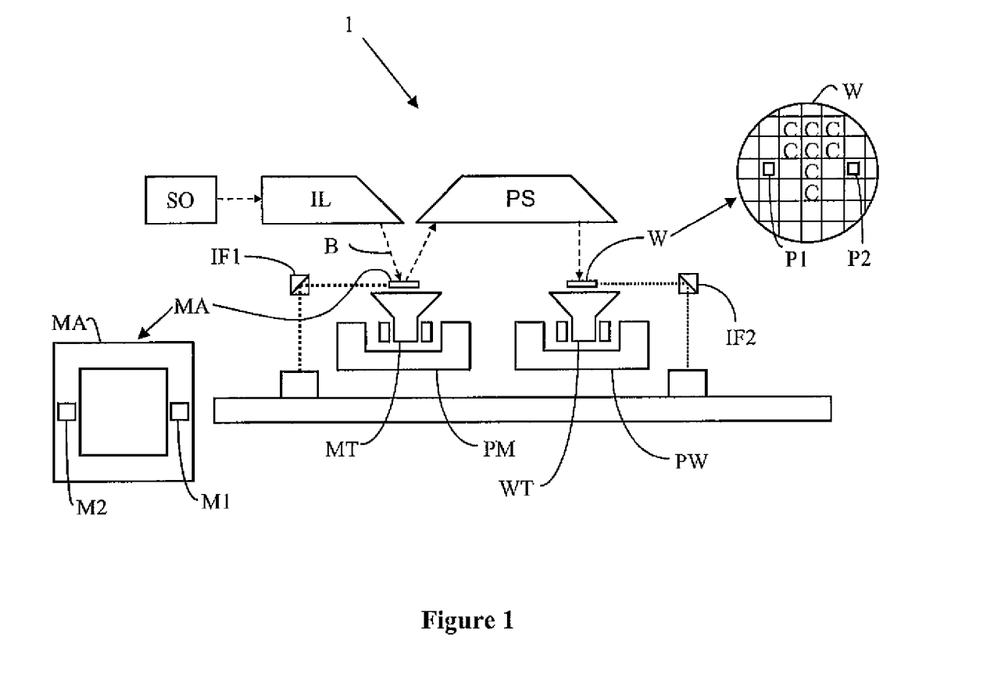
FIG. 1 schematically depicts a lithographic apparatus according to an embodiment of the invention.

FIG. 1 schematically depicts a lithographic apparatus 1 according to an embodiment of the invention. The apparatus 1 comprises a source SO configured to generate a radiation beam (e.g. EUV radiation); an illumination system (illuminator) IL configured to condition a radiation beam B (e.g. EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam 13 by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus 1, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

Examples of patterning devices include masks and programmable mirror arrays. Masks are well known in lithography, and typically, in an EUV radiation lithographic apparatus, would be reflective. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system. Usually, in an EUV radiation lithographic apparatus the optical elements will be reflective. However, other types of optical element may be used. The optical elements may be in a vacuum. Any use of the term "projection lens" herein may be considered as synonymous with the more general term "projection system".

As here depicted, the apparatus 1 is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation emission point by means of the radiation source SO. The source and the lithographic apparatus may be separate entities. In such cases, the source may be considered not to form part of the lithographic apparatus. The radiation beam may be passed from the source SO to the illuminator IL with the aid of a beam delivery system comprising, for example, suitable directing mirrors and/or a beam expander. In other cases the source may be an integral part of the lithographic apparatus. The source SO and the illuminator IL, together with the beam delivery system if required, may be referred to as a radiation system. The source SO is described further below.

The illuminator IL may comprise an adjuster for adjusting the angular intensity distribution of the radiation beam. Generally, at least the outer and/or inner radial extent (commonly referred to as r-outer and u-inner, respectively) of the intensity distribution in a pupil plane of the illuminator can be adjusted. In addition, the illuminator IL may comprise various other components, such as an integrator and a condenser. The illuminator IL may be used to condition the radiation beam B to have a desired uniformity and intensity distribution in its cross-section.

The radiation beam B is incident on the patterning device (e.g., mask MA), which is held on the support structure (e.g., mask table MT), and is patterned by the patterning device. Having been reflected by the mask MA, the radiation beam B passes through the projection system PS, which focuses the beam onto a target portion C of the substrate W. With the aid of the second positioner PW, and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus 1 could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the plane of the substrate so that a different target portion C can be exposed. In step mode, the maximum size of the exposure field limits the size of the target portion C imaged in a single static exposure, 2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
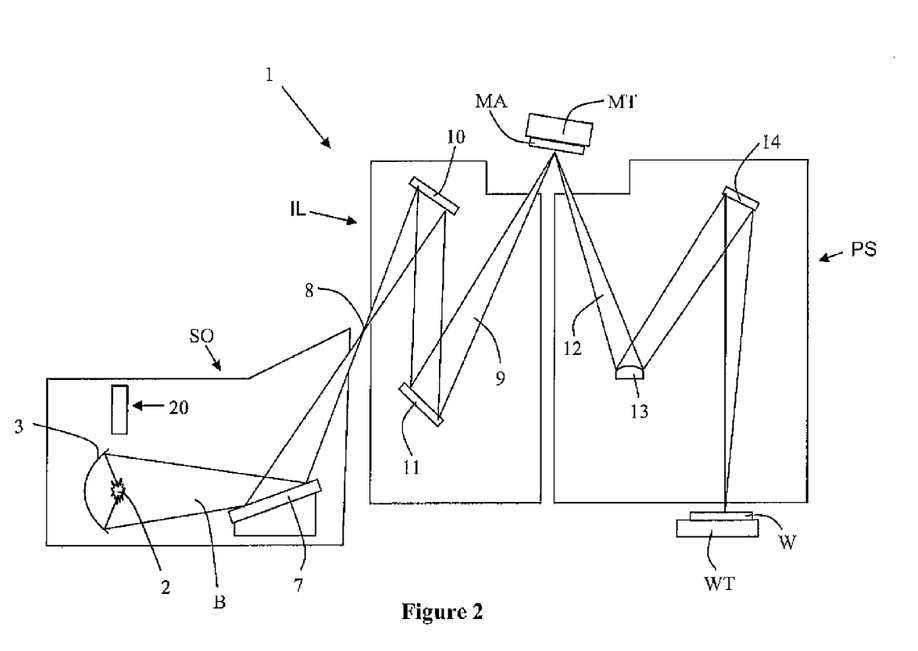
FIG. 2 is a more detailed but schematic illustration of the lithographic apparatus of FIG. 1.

FIG. 2 shows the apparatus of FIG. 1 in more detail, including the source SO, the illuminator IL, and the projection system PS. The source SO generates extreme ultraviolet (EUV) radiation from a plasma 2. The plasma 2 is created by directing laser radiation (not shown in FIG. 2) onto droplets of a suitable fuel material such as Sn or Gd, which are generated by a fuel droplet generator 20. The laser radiation causes the droplets to be vaporized, thereby generating the plasma 2.

EUV radiation emitted by the plasma 2 is collected by a collector 3 to form an EUV radiation beam B. The EUV radiation beam B is directed onto a grating spectral filter 7. The EUV radiation beam then passes from the grating spectral filter 7 to an intermediate focus 8. The intermediate focus 8 acts as a virtual source point 8 at an aperture in the source SO. The EUV radiation beam 9 is reflected in the illuminator IL via first and second normal incidence reflectors 10, 11 onto a patterning device MA (e.g. a mask) positioned on support structure MT. A patterned EUV radiation beam 12 is formed which is imaged in the projection system PS via first and second reflective elements 13, 14 onto a substrate W held on a substrate table WT. More elements than shown may generally be present in the illuminator IL and projection system PS.

Figure 3:
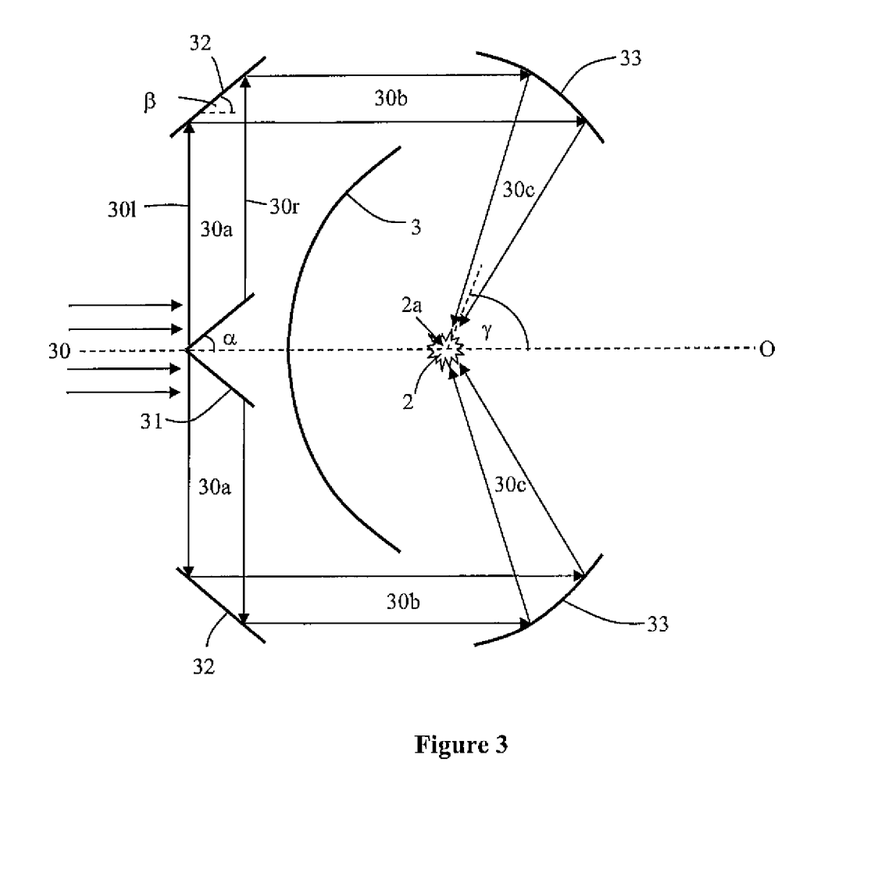
FIG. 3 is a schematic cross-sectional view of a radiation source according to an embodiment of the invention.

FIG. 3 shows schematically part of the source SO of FIGS. 1 and 2. Optics which comprise first, second and third mirrors 31-33 are shown in FIG. 3, together with the collector 3. The minors 31-33 are configured to direct a laser beam 30 to be incident upon a fuel droplet at an interaction point 2a, and thereby form the plasma 2. The collector 3 collects EUV radiation emitted by the plasma 2 and forms the EUV radiation into an EUV radiation beam.

Although FIG. 3 is shown in two dimensions, the mirrors 31-33 (and the collector 3) are three-dimensional. The first mirror 31 is conical and has a reflective outer surface. This mirror is hereafter referred to as the conical mirror 31. The second mirror 32 is frustoconical and has a reflective inner surface. This minor is hereafter referred to as the frustoconical minor 32. The third mirror 33 of the mirror arrangement is generally frustoconical but has a concave reflective inner surface. The term generally frustoconical may be interpreted as encompassing a mirror which approximates a frustoconical form, but is not fully frustoconical because it includes some curvature (e.g. to provide an optical power). The third mirror is hereafter referred to as the curved mirror 33. In this embodiment, the mirrors 31-33 are rotationally symmetric about an axis O, which may be considered to be the optical axis of the minors. In an embodiment, the mirrors 31-33 may be non-rotationally symmetric.

In use, a fuel droplet travels from the fuel droplet generator (20 in FIG. 2) to the interaction point 2a (the fuel droplet passes between the collector 3 and the curved mirror 33). A laser (not shown) generates the laser beam 30 at a wavelength which is suitable for vaporizing and exciting a fuel droplet to produce the plasma 2. The laser may for example be a $CO_2$ laser. The laser beam 30 may be collimated.

The laser beam 30, which may have a disc-shaped cross-section, is represented by four arrows in FIG. 3. The laser beam is incident upon the conical minor 31, which reflects the laser beam in directions transverse to the optical axis O, thereby providing radially propagating laser radiation 30a. This reflection of the laser radiation in the radial direction arises from a 45° angle α subtended by the reflective surface of the conical mirror 31 relative to the optical axis O. The width of the reflected laser beam is defined on one side 30l by the apex of the conical mirror 31, and on the other side 30r by the outer perimeter of the incident laser beam 30.

The frustoconical mirror 32 reflects the radially extending laser radiation 30a such that the laser radiation then propagates parallel to the optical axis O in an annular distribution 30b. This reflection of the laser radiation arises from a 45° angle β subtended by the reflective surface of the frustoconical mirror 32 relative to the optical axis O.

The curved mirror 33 reflects the annularly distributed laser radiation 30b as converging annularly distributed laser radiation 30c. The laser radiation 30c is focused towards the interaction point 2a where the plasma 2 is to be formed. The focused laser radiation 30c vaporizes a fuel droplet at interaction point 2a, thereby generating a plasma 2 which emits EUV radiation.

The configuration of the optics (mirrors 31-33) shown in FIG. 3 provides illumination of the interaction point 2a in such a way that the plasma 2, in combination with the collector 3, provides a more homogeneous EUV radiation beam. In this context, the term 'more homogeneous' is intended to mean more homogenous than would have been the case if the interaction point had been illuminated in the conventional manner known from the prior art (i.e. by a laser beam passing through an aperture in the center of the collector 3).

In order to aid understanding of why the configuration of mirrors shown in FIG. 3 is advantageous, the manner in which EUV radiation is generated from a fuel droplet will be explained. When a laser beam is incident upon a fuel droplet, the resulting plasma emits EUV radiation along the direction of propagation of the incident laser beam, and also against the direction of propagation of the incident laser beam. EUV radiation is emitted at other angles, but the intensity of the emitted EUV radiation decreases as the angle subtended relative to the axis of the incident laser beam increases. The intensity of radiation emitted by the EUV emitting plasma may be fitted by an intensity profile centered around the axis of the incident laser radiation 30c. The intensity profile may for example be based upon a Gaussian, Lambertian or parabolic form.

In a conventional prior art source, the plasma 2 would be generated by a laser beam which passed through an aperture in the center of the collector 3. In this situation, the highest intensity portion of the emitted EUV radiation would travel towards the center of the collector 3 and adjacent areas of the collector. Lower intensity radiation would be emitted towards outer areas of collector 3. This effect would give rise to inhomogeneity in the EUV radiation beam formed by the source. In particular, the intensity of the EUV radiation would be substantially greater at the center of the EUV radiation beam than at edges of the EUV radiation beam. This undesirable intensity variation across the cross-section of the EUV radiation beam would be increased by effects arising from the shape and variable reflectivity of the collector, as is described below.

The collector 3 may be formed as a partial ellipse (both in the prior art and in embodiments of the invention). The interaction point 2a of the collector 3 is located in a first focus of the ellipse, and the intermediate focus 8 (see FIG. 2) is located at a second focus of the ellipse. Since the collector 3 is a partial ellipse, the center of the collector is closer to the interaction point 2a than outer areas of the collector. This difference in distance may be significant. For example, outer areas of the collector 3 may be more than 30%, more than 40%, or more than 50% further away from the interaction point 2a than the center of the collector. A central area of the collector may for example be 20 cm from the interaction point 2a, and outer areas of the collector may be more than 30 cm from the interaction point. Since the central area of the collector 3 is closer to the interaction point 2a than outer areas of the collector, the central area will receive a higher intensity of EUV radiation than the outer areas (this would occur even if the BUY radiation emitted by the plasma 2 were to be homogenous). This variation of the intensity of EUV radiation received by the collector 3 causes the collector to reflect higher intensity EUV radiation from the central area and lower intensity EUV radiation from outer areas.

A variation of the intensity of EUV radiation reflected by the collector 3 may also arise from the manner in which the collector 3 reflects the EUV radiation. The collector 3 has a reflective surface formed from a plurality of layers. The layers have a layer spacing such that EUV radiation incident at 90° (perpendicular) gives rise to constructive interference, thereby forming a reflected EUV radiation beam. The elliptical shape of the collector 3 is such that EUV radiation which is incident close to the center of the collector 3 will have a close to perpendicular incidence angle, whereas EUV radiation incident at outer areas of the collector will have an incident angle which is significantly further away from the perpendicular. As a consequence of this, the BUY radiation close to the center of the collector will be reflected more efficiently than EUV radiation at outer areas of the collector.

The three effects described above all independently cause an EUV radiation beam formed using a conventional prior art source to be more intense close to the center of the BUY radiation beam and less intense away from the center of the EUV radiation beam. The three effects act in concert (i.e. they all add together), thereby increasing the magnitude of this undesirable intensity variation.

The mirror arrangement shown in FIG. 3 reduces the undesirable variation of the intensity of the EUV radiation beam generated by the source (compared with a conventional prior art source). This reduction of the intensity variation arises in part from the illumination of the interaction point 2a by laser radiation 30c which does not lie on the optical axis O.

The reduced intensity variation of the EUV radiation beam may also arise in part from the fact that the laser radiation 30c is incident upon more than one side of the fuel droplet at the interaction point 2a. The intensity variation may be less than would be seen for example if the laser radiation 30c were to be incident on only one side of the fuel droplet 2. FIG. 3 shows the laser radiation 30c being incident upon two sides of the fuel droplet (from above and below). However, since FIG. 3 is a schematic illustration of a three-dimensional apparatus (as explained further above), the laser radiation 30c may be considered to be incident upon more than two sides of the fuel droplet.

Focused laser radiation 30c is incident upon a fuel droplet at the interaction point 2a at an angle γ relative to the optical axis O. The angle γ may for example be greater than 45°, greater than 60°, greater than 70° or greater than 80°. The angle may be 90°. The resulting plasma 2 emits EUV radiation with an intensity distribution which is shown schematically in FIG. 4. For ease of illustration, FIG. 4 shows the focused laser radiation 30c traveling to the interaction point 2a from only one side of the curved mirror 33.

The plasma 2 emits EUV radiation with an intensity distribution which is indicated schematically by a dashed line 40. The dashed line 40 is intended as a schematic representation of the intensity distribution of the emitted EUV radiation in order to aid understanding of the embodiment of the invention, and is not intended to be an accurate representation of the intensity distribution of the emitted EUV radiation.

Figure 4:
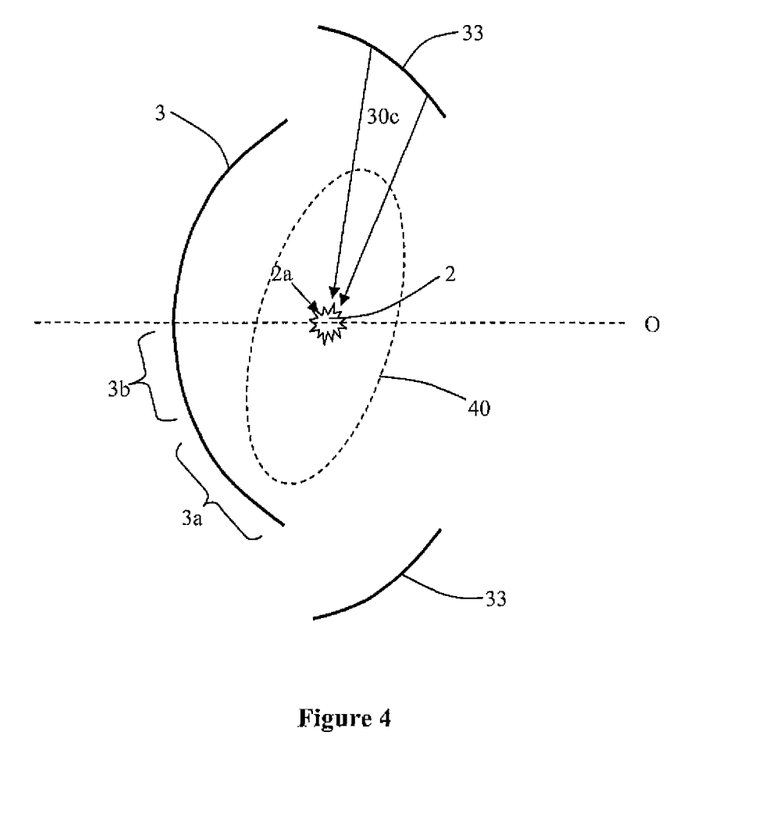
FIG. 4 is a schematic cross-sectional view of part of the radiation source of FIG. 3.

As can be seen from FIG. 4, higher intensity EUV radiation is emitted towards an outer area of the collector 3a, whereas lower intensity EUV radiation is emitted towards a central area of the collector 3b.

As explained further above, the outer area 3a of the collector 3 is further away from the interaction point 2a than a central area 3b of the collector. This means that the higher intensity EUV radiation emitted by the plasma 2 must travel further to the collector 3 (it travels to the outer area 3a of the collector), whereas the lower intensity EUV radiation travels less distance to the collector 3 (it travels to a central area 3b of the collector). Since the higher intensity EUV radiation must travel further to the collector 3, it is spread over a wider range of angles once it reaches the collector 3, and therefore is less intense when it is incident upon the collector. The lower intensity radiation travels less distance to the collector, is spread over a smaller range of angles, and therefore experiences a smaller reduction of intensity. The intensity variation which arises from the elliptical shape of the collector 3 thereby acts in an opposite sense to the intensity variation 40 of the radiation emitted from the plasma.

As mentioned further above, the reflectivity of the collector 3 is dependent upon the angle at which the EUV radiation is incident upon the collector. This effect also acts in an opposite sense to the intensity variation 40 of the radiation emitted from the plasma.

By generating a plasma which emits higher intensity EUV radiation towards outer areas 3a of the collector 3, and reducing the intensity of EUV radiation reflected at the outer areas 3a of the collector 3, an EUV radiation beam is provided which may be more homogeneous than an EUV radiation beam provided by a conventional source.

FIG. 4 shows the laser radiation 30c incident upon the interaction point 2a as a single beam. However, since the curved mirror 33 is generally frustoconical in shape, the laser radiation 30c will be incident upon the interaction point 2a as a converging annular distribution rather than as a single beam. The laser radiation 30c is thus incident upon the interaction point 2a from a plurality of different sides. Similarly, the EUV radiation emitted by the plasma 2 has a three-dimensional distribution rather than a two-dimensional distribution 40 shown in FIG. 4. One way in which this three-dimensional distribution may be pictured conceptually is by rotating the two-dimensional distribution 40 about the optical axis O.

Since the laser radiation 30c is incident upon the interaction point 2a as a converging annular distribution, it may subtend more than one angle relative to the optical axis O. The angle γ may therefore in some instances be a range of angles.

Figure 5:
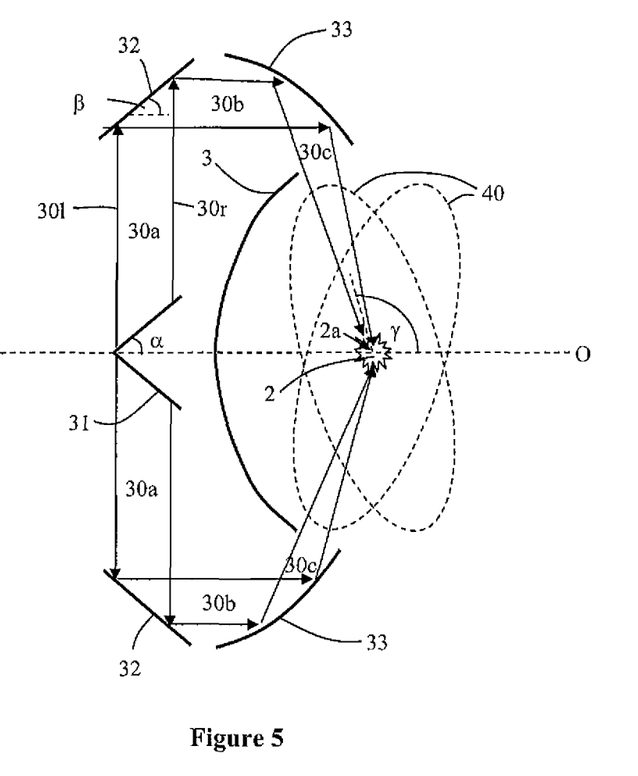
FIG. 5 is a schematic cross-sectional view of part of a radiation source according to an embodiment of the invention.

FIG. 5 shows a configuration of optics 31-33 which is similar to that shown in FIG. 3. However, in FIG. 5 the curved mirror 33 is significantly closer to the frustoconical mirror 32. As a consequence, the curved mirror directs the laser radiation 30c towards the interaction point 2a at an angle γ of approximately 100°. The angle γ may for example be less than 135°, less than 120°, less than 110°, or less than 100°. The angle γ may be 90°.

When the optics 31-33 shown in FIG. 5 are used, fuel droplets may travel from the generator (20 in FIG. 2) to the interaction point 2a by passing beyond the outside of the curved mirror 33 (i.e. to the right of the curved mirror).

As mentioned above, the curved mirror 33 may be positioned such that it directs the laser radiation 30c towards the interaction point 2a at an angle γ of 90°. Where this is the case, curved mirror 33 may surround the interaction point 2a. An opening may be provided in the curved mirror 33 to allow fuel droplets to travel from the fuel droplet generator to the interaction point 2a.

Figure 6:
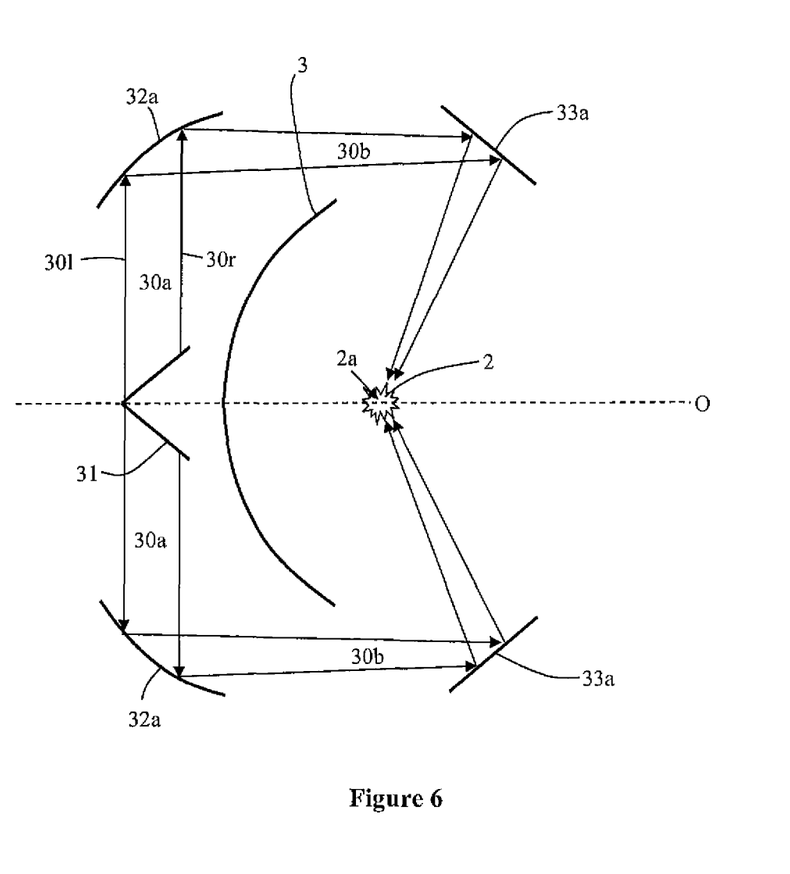
FIG. 6 is a schematic cross-sectional view of a radiation source according to an embodiment of the invention.

As described further above, the curved mirror 33 is shaped such that the laser radiation 30c is focused at the interaction point 2a. Although it is desirable to have some focusing of the laser radiation in order to increase the intensity of the laser radiation at the interaction point 2a, it is not necessary that the focusing of the laser radiation be provided by the curved mirror 33. In an alternative arrangement, shown in FIG. 6, the frustoconical mirror 32 is replaced with a curved mirror 32a, and the curved mirror 33 is replaced with a frustoconical mirror 33a. The mirrors 31, 32a, 33a shown in FIG. 6 work in the same way as the mirrors shown in FIG. 3, except that focusing of the laser radiation is provided by the curved mirror 32a. Since the optical path length from the curved mirror 32a to the interaction point 2a is greater than the optical path length from the curved mirror 33 of FIG. 3 to the interaction point 2a, the optical power of the curved mirror 32a is less (the optical power is selected such that the laser radiation 30 is focused at the interaction point 2a).

In an embodiment (not shown), the conical mirror 31 may have a curved reflective surface, such that focusing of the laser radiation 30 begins at the conical mirror. In general, one or more of the mirrors 31-33 of the mirror arrangement may be curved (i.e. have an optical power).

The optics of the embodiments of the invention illustrated in FIGS. 3 to 5 comprise a conical mirror and two mirrors which are generally frustoconical (one or more of which may provide some focusing optical power). These mirrors provide illumination of the interaction point 2a with laser radiation formed into a converging annular distribution (the point of convergence coinciding with the interaction point). However, it is not necessary for the interaction point 2a to be illuminated by a converging annular distribution of laser radiation. The interaction point may for example be illuminated by two or more beams of radiation (for example two beams, three beams, four beams or more). The two or more beams of radiation are incident on the two or more sides of the fuel droplet at the interaction point 2a.

Referring again to FIG. 3, the first mirror 31, instead of being a conical mirror, may for example comprise two rectangular mirrors which extend into the plane of the Figure (referred to here as the first planar reflecting mirrors 31). The second mirror 32, instead of comprising a frustoconical mirror, may comprise two planar mirrors which extend into the plane of the Figure (referred to hereafter as second planar mirrors 32). The third mirror 33, instead of comprising a generally frustoconical curved mirror, may comprise two generally planar but curved mirrors which extend into the plane of the Figure. The term generally planar but curved minor is intended to mean a mirror which would be planar if it had no optical power, but has curvature which provides its optical power. The generally planar but curved mirrors are referred to hereafter as focusing mirrors 33. The focusing mirrors 33 may, in addition to being curved in the plane of the Figure, also be curved transverse to the plane of the Figure. The focusing mirrors 33 may thereby provide focusing of the laser radiation 30c both in the plane of the Figure and transverse to the plane of the Figure.

The mirrors described above will give rise to two beams of laser radiation which are focused onto the fuel droplet at the interaction point 2a.

In an alternative arrangement, instead of the first mirror 31 comprising two rectangular mirrors, the first mirror may comprise four triangular minors arranged as four-sided pyramid. In addition, four planar mirrors 32 and four curved mirrors 33 may be provided. This will give rise to four beams of laser which are focused onto the interaction point 2a.

In a further alternative arrangement, instead of the first mirror 31 comprising two rectangular mirrors, the first mirror may comprise three triangular mirrors arranged as three-sided pyramid. In addition, three planar mirrors 32 and three curved mirrors 33 may be provided. This will give rise to three beams of laser which are focused onto the interaction point 2a.

Any other number of mirrors may be used.

Figure 7:
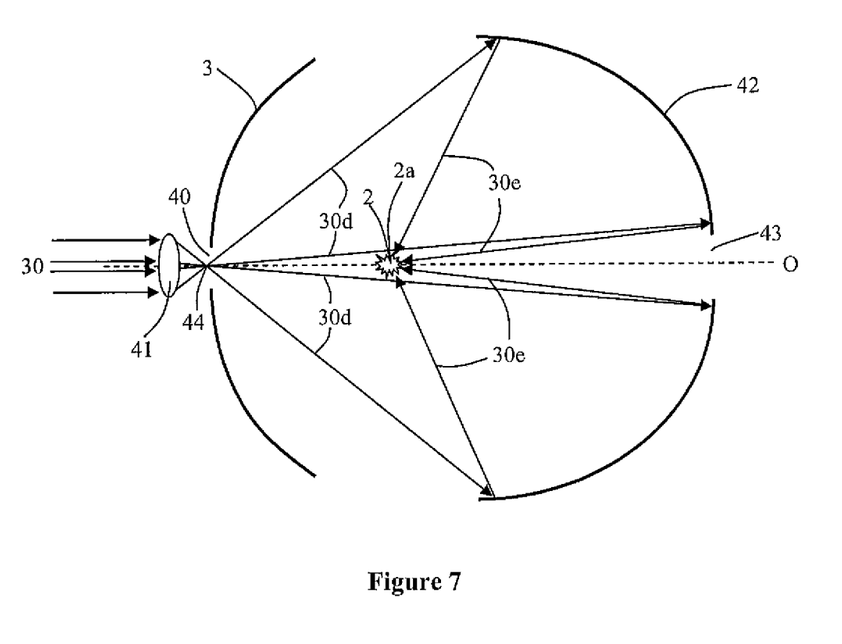
FIG. 7 is a schematic cross-sectional view of a radiation source according to an embodiment of the invention.

FIG. 7 shows schematically an embodiment of the invention. In FIG. 7, a collector 3 is provided with an aperture 40 at its center. A transmissive focusing lens 41 is located behind the collector 3 and is coaxial with the aperture 40 (both the lens 41 and the aperture 40 lie on an optical axis O). A curved mirror 42 is provided on an opposite side of the interaction point 2a from the collector 3. An aperture 43 is provided at the center of the curved mirror 42, the aperture lying on the optical axis O. The transmissive focusing lens 41 and the curved mirror 42 together comprise optics configured to deliver laser radiation 30 to the interaction point 2a.

In use, a laser beam 30 is directed at the lens 41, which focuses the laser beam to a focus 44. The focus 44 lies in (or is close to) the aperture 40 in the collector 3. Once it has passed through the focus 44, the laser radiation diverges over a range of angles. Example rays of radiation in the diverging laser radiation are represented by arrows 30d. The curved mirror 42 collects the diverging laser radiation and focuses towards the interaction point 2a as converging annularly distributed laser radiation 30e.

A droplet of fuel material delivered to the interaction point 2a will be vaporized and excited by the focused laser beam and will thereby form an EUV emitting plasma 2. The plasma 2 emits EUV radiation over a range of angles. Since the incident laser beam is incident at the interaction point over a wide range of angles, the distribution of the EUV radiation emitted by the plasma is more complex than that schematically illustrated in FIG. 4 and it is not shown in FIG. 7. The EUV radiation is distributed over a range of angles.

The collector 3 collects the EUV radiation and focuses it to an intermediate focus which may for example be located at or close to the aperture 43 provided in the curved mirror 42.

Although the curved mirror 42 is shown in only two dimensions, it is a three-dimensional mirror and may for example have an elliptical shape, a parabolic shape, or some other suitable shape.

A potential advantage of the embodiment of the invention shown in FIG. 7, compared with a conventional prior art source, arises from the fact that the laser beam 30e illuminates the interaction point 2a over a range of angles rather than merely as a linear laser beam. The plasma 2 generates EUV radiation over a wider range of angles than in a conventional prior art source. The EUV radiation which is collected by the collector 3 thus forms an EUV radiation beam which may be more homogenous than an EUV radiation beam formed by a conventional source.

The embodiment of the invention illustrated in FIG. 7 differs from the embodiments illustrated in FIGS. 3 to 6. However, all of the embodiments have in common that they do not illuminate the interaction point 2a with a single laser beam which is incident upon the interaction point from one direction only. Instead, the interaction point is illuminated with converging annularly distributed laser radiation, or with a plurality of beams of laser radiation which are incident on the interaction point from a plurality of different locations.

The embodiment of the invention illustrated in FIGS. 3 to 6 includes a longer path length of the laser radiation 30 compared with a conventional EUV source. However, the increase of path length is likely to be a relatively small fraction of the path length already traveled by the laser radiation. For example, the mirrors shown in FIG. 3 may add around 1 to 2 meters of additional path length. However, the laser radiation may already have traveled 15 meters prior to being incident upon the conical mirror 31. Consequently, an increase of the path length by 2 meters is likely to have a negligible effect on the laser radiation.

Embodiments of the invention may provide an improvement of the homogeneity of the EUV radiation beam compared with that formed by a conventional prior art source. This may be achieved without modifying the shape of the collector 3. There is little flexibility available in relation to the shape of the collector 3. This is because it is desirable that the collector have an elliptical shape such that the interaction point 2a is located at a first focus of the ellipse, and the intermediate focus of the EUV radiation beam is at the second focus of the ellipse.

Improving the homogeneity of the EUV radiation beam using the invention may be advantageous because it may allow the illuminator IL of the lithographic apparatus (see FIGS. 1 and 2) to provide a more homogeneous illumination mode, which may in turn allow the projection system PS to project a pattern from a patterning means MA onto a substrate W with improved accuracy.

The embodiments of the invention may provide an EUV radiation beam with an improved homogeneity compared with the EUV radiation which would be provided by a conventional prior art EUV source. Although the homogeneity of the EUV radiation beam may be improved, it is not necessarily the case that the EUV radiation beam is fully homogenous.

The term generally frustoconical has been used above in relation to some of the mirrors of the optics. This term may be interpreted as encompassing a mirror which approximates a frustoconical form, but is not fully frustoconical because it includes some curvature (e.g. to provide an optical power).

It is appreciated that the fuel vaporizing and exciting radiation is, upon excitation of the fuel, further propagating in directions substantially different from the directions of the EUV radiation beam propagating along the optical axis O and used for illuminating a mask and patterning a substrate. Consequently, detrimental effects due to vaporizing and exciting radiation on optic elements along the optical path of the EUV radiation beam, such as a spectral purity filter and a mirror element of the illumination system or the projection systems, may be further mitigated in the embodiments above.

Described embodiments of the invention have referred to using laser radiation 30, 30a-e to vaporize and excite a fuel droplet in order to form a plasma 2. However, it is not essential that a laser beam is used. Radiation generated by a source other than a laser may be used. In general, the radiation used to vaporize and excite the fuel droplet may be referred to as fuel vaporizing and exciting radiation.

Described embodiments of the invention have referred to various methods of delivering fuel droplets from the droplet generator 20 to the interaction point 2a. These include passing the fuel droplets between the collector 3 and the curved mirror 33, and passing the fuel droplets outside of the curved mirror 33 (i.e. to the right of the curved mirror). Although these methods deliver the fuel droplets from a direction which is perpendicular to the optical axis O, the fuel droplets may be delivered from a direction which is not perpendicular to the optical axis O.

Although specific reference may be made in this text to the use of lithographic apparatus in the manufacture of integrated circuits, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc.

The terms "radiation" and "beam" used herein encompass, where the context allows, all types of electromagnetic radiation, including ultraviolet (UV) radiation (e.g. having a wavelength of or about 365, 355, 248, 193, 157 or 126 nm). The term EUV radiation encompasses radiation which for example has a wavelength in the range of 5-20 nm.

The descriptions above are intended to be illustrative, not limiting. Thus, it will be apparent to one skilled in the art that modifications may be made to the invention as described without departing from the scope of the claims set out below.

What is claimed is:

1. A source configured to generate EUV radiation, the source comprising:
    a fuel droplet generator configured to deliver a droplet of fuel to an interaction point;
    optics configured to deliver fuel vaporizing and exciting radiation from a single laser to the interaction point, the optics being arranged such that in use the fuel vaporizing and exciting radiation from the single laser is incident upon more than one side of the fuel droplet at the interaction point to generate a plasma; and
    a collector arranged to collect EUV radiation emitted by the plasma.

2. The source of claim 1, wherein the optics comprise mirrors configured to direct the fuel vaporizing and exciting radiation past an outer perimeter of the collector, and to then direct the fuel vaporizing and exciting radiation towards the interaction point.

3. The source of claim 1, wherein the optics comprise mirrors configured to direct the fuel vaporizing and exciting radiation past the interaction point, and to then direct the fuel vaporizing and exciting radiation towards the interaction point.

4. The source of claim 1, wherein the optics are arranged such that the fuel vaporizing and exciting radiation will subtend an angle between 45° and 135° relative to an optical axis of the collector when the fuel vaporizing and exciting radiation is incident upon the fuel droplet.

5. The source of claim 4, wherein the optics are arranged such that the fuel vaporizing and exciting radiation will subtend an angle of between 70° and 110° relative to the optical axis of the collector when the fuel vaporizing and exciting radiation is incident upon the fuel droplet.

6. The source of claim 1, wherein the optics are arranged such that at lease some of the fuel vaporizing and exciting radiation will subtend an angle of 90° relative to an optical axis of the collector when the fuel vaporizing and exciting radiation is incident upon the fuel droplet.

7. The source of claim 1, wherein the optics comprise a conical mirror with a reflective outer surface, and two generally frustoconical mirrors with reflective inner surfaces.

8. The source of claim 7, wherein at least one of the mirrors has an optical power such that the fuel vaporizing and exciting radiation is focused towards the interaction point.

9. The source of claim 1, wherein the optics comprise a conical or pyramid shaped mirror with generally planar reflective outer surfaces, and at least four generally planar mirrors.

10. The source of claim 9, wherein at least one of the mirrors has an optical power such that the fuel vaporizing and exciting radiation is focused towards the interaction point.

11. The source of claim 1, wherein the optics are further arranged to deliver the fuel vaporizing and exciting radiation to the interaction point with a converging annular distribution.

12. A source configured to generate EUV radiation, the source comprising: a fuel droplet generator configured to deliver a droplet of fuel to an interaction point; optics configured to deliver fuel vaporizing and exciting radiation from a single laser to the interaction point, the optics being arranged to deliver the fuel vaporizing and exciting radiation to the interaction point with a converging annular distribution to generate a plasma; and a collector arranged to collect EUV radiation emitted by the plasma.

13. The source of claim 12, wherein the optics comprise:
    a lens configured to focus the fuel vaporizing and exciting radiation through an aperture in the collector and to cause the fuel vaporizing and exciting radiation to diverge past the interaction point; and
    a focusing mirror configured to focus the fuel vaporizing and exciting radiation back towards the interaction point.

14. The source of claim 12, wherein the optics comprise mirrors configured to direct the fuel vaporizing and exciting radiation past an outer perimeter of the collector, and to then direct the fuel vaporizing and exciting radiation towards the interaction point.

15. The source of claim 12, wherein the optics comprise mirrors configured to direct the fuel vaporizing and exciting radiation past the interaction point, and to then direct the fuel vaporizing and exciting radiation towards the interaction point.

16. The source of claim 12, wherein the optics comprise a conical mirror with a reflective outer surface, and two generally frustoconical mirrors with reflective inner surfaces.

17. The source of claim 16, wherein at least one of the mirrors has an optical power such that the fuel vaporizing and exciting radiation is focused towards the interaction point.

18. A lithographic apparatus comprising:
    a source configured to generate EUV radiation, the source comprising
        a fuel droplet generator configured to deliver a droplet of fuel to an interaction point,
        optics configured to deliver fuel vaporizing and exciting radiation from a single laser to the interaction point, the optics being arranged such that in use the fuel vaporizing and exciting radiation from the single laser is incident upon more than one side of the fuel droplet at the interaction point to generate a plasma, and
        a collector arranged to collect EUV radiation emitted by the plasma;
    an illumination system configured to condition an EUV radiation beam formed by the collector;
    a support structure constructed to hold a patterning device, the patterning device being capable of imparting the EUV radiation beam with a pattern in its cross-section to form a patterned EUV radiation beam; a substrate table constructed to hold a substrate; and a projection system configured to project the patterned EUV radiation beam onto a target portion of the substrate.

19. A method of generating EUV radiation comprising:

delivering a droplet of fuel to an interaction point;

delivering fuel vaporizing and exciting radiation from a single laser to the interaction point such that the fuel vaporizing and exciting radiation from the single laser is incident upon more than one side of the fuel droplet at the interaction point such that the fuel droplet vaporizes and forms a plasma;

collecting the EUV radiation emitted by the plasma with a collector; and forming the EUV radiation into a beam for use in lithography.

* * * * *